United States Patent [19]
Black

[11] Patent Number: 5,751,195
[45] Date of Patent: May 12, 1998

[54] CIRCUIT TO INDICATE PHASE LOCK IN A MULTIMODE PHASE LOCK LOOP WITH ANTI-JAMMING SECURITY

[75] Inventor: Michael F. Black, Garland, Tex.

[73] Assignee: Texas Instruments Incopprporated, Dallas, Tex.

[21] Appl. No.: 760,888

[22] Filed: Dec. 6, 1996

[51] Int. Cl.$^6$ .................................................. H03L 7/095
[52] U.S. Cl. ........................... 331/17; 331/1 A; 331/2; 331/4; 331/25; 331/64; 331/74; 331/DIG. 2; 342/199; 455/226.4; 455/260
[58] Field of Search ............................. 331/1 A, 2, 4, 331/17, 25, 64, 74, DIG. 2; 327/156–159; 342/199; 455/226.1–226.4, 260

[56] References Cited

U.S. PATENT DOCUMENTS

| | | | |
|---|---|---|---|
| 3,882,412 | 5/1975 | Apple, Jr. | 331/1 A |
| 4,270,093 | 5/1981 | Miille | 331/17 |
| 4,866,402 | 9/1989 | Black | 331/1 A |

*Primary Examiner*—David Mis
*Attorney, Agent, or Firm*—René E. Grossman; Richard L. Donaldson

[57] ABSTRACT

A lock detection circuit for a phase lock loop circuit having a phase lock loop circuit, generally a series circuit of a detector, a filter and a VCO with a PLL input terminal and an output terminal. A test circuit is coupled to the phase lock loop and includes a signal generator responsive to the presence of an input signal on the input terminal to inject a test signal into the phase lock loop. The signal generator is preferably a low frequency oscillator wherein the term "low" is defined to mean any frequency from a few hertz up to gigahertz and generally a few kilohertz, as long as this frequency is at least about an order of magnitude less than the frequencies to be encountered at the RF input to the PLL. The signal generated by the signal generator is compared with the signal injected into the phase lock loop which is generally injected ahead of the loop filter. When there is a substantial match, particularly in frequency and phase of the injected signal, it is assumed that the PLL circuit is operating properly and the PLL output is then permitted to be transmitted, used or the like. The injected signals can be any signals including a series of pulses, a swept frequency signal or a random signal. The circuit can also include an inhibit circuit coupled to the output terminal of the phase lock loop which normally inhibits an output from the output terminal of the phase lock loop and is responsive to a substantial match of the signal generated by the signal generator and the signal injected into the phase lock loop to disinhibit the inhibit circuit.

21 Claims, 1 Drawing Sheet

CIRCUIT TO INDICATE PHASE LOCK IN A MULTIMODE PHASE LOCK LOOP WITH ANTI-JAMMING SECURITY

BACKGROUND OF THE INVENTION

1. Field of the Invention

This invention relates to phase lock loops and, more specifically, to a circuit used in conjunction with a phase lock loop to indicate phase lock.

2. Brief Description of the Prior Art

A phase lock loop (PLL) is a circuit which is responsive to and detects a predetermined frequency to the exclusion of other frequencies. A typical example of a PLL is a circuit at the telephone company that detects which of ten possible tones has been transmitted.

Lock detection in phase lock loops is a valuable tool in many military and non-military applications as, for example, military aircraft, wherein awareness that a radar has locked onto the aircraft is essential for initiation of countermeasures. A system known as GEN-X uses a non-sweeping integrated circuit version of such a detector and is shown in U.S. Pat. No. 4,866,402, the contents of which are incorporated herein by reference.

Lock detection in phase lock loops is difficult. When the input signal is a pulsed waveform, as is the case with more modern radars, the problem of lock detection becomes even more acute because it is difficult to obtain a signature of the radar in question. As an anti-jamming measure, the waveform may include attempts to harass the loop or interfere with the lock detector. The prior art does not discuss or allow for either a pulsed input or the possibility of jamming of the lock detector. It is apparent that a remedy for such conditions is essential to lock detection and indication.

SUMMARY OF THE INVENTION

In accordance with the present invention, there is provided a lock indication for a phase lock loop with either a continuous or pulsed input over a wide range of frequencies which is also capable of thwarting many types of attempts to jam the detector.

Briefly, a low frequency tone is injected into the phase lock loop filter. The tone circulates through the loop, modulating the voltage controlled oscillator (VCO) and being mixed down by the phase detector. The second phase detector compares the mixed down signal with the signal originally injected. Lock is declared only if the second signal is at exactly the right frequency and phase.

The lock detection circuit for a phase lock loop circuit comprises a phase lock loop circuit, which is generally the series circuit of a detector, a filter and a VCO with a PLL input terminal and an output terminal. The test circuit is coupled to the phase lock loop and includes a signal generator responsive to the presence of an input signal on the input terminal to inject a test signal into the phase lock loop. The signal generator is preferably a low frequency oscillator wherein the term "low" is defined to mean any frequency from a few hertz up to gigahertz and generally a few kilohertz, as long as this frequency is at least an order of magnitude less than the frequencies to be encountered at the RF input to the PLL. The signal generated by the signal generator is compared with the signal injected into the phase lock loop which is generally injected ahead of the loop filter. When there is a substantial match, particularly in frequency and phase of the injected signal, it is assumed that the PLL circuit is operating properly and the PLL output is then permitted to be transmitted, used or the like. The injected signals can be any signals including a series of pulses, a swept frequency signal or a random signal. The circuit can also include an inhibit circuit coupled to the output terminal of the phase lock loop which normally inhibits an output from the output terminal of the phase lock loop and is responsive to a substantial match of the signal generated by the signal generator and the signal injected into the phase lock loop to disinhibit the inhibit circuit.

The present invention is superior to prior art circuits by demonstrating that the injected signal can vary in frequency. In fact, the injected signal can be swept in any predetermined or random fashion and can in the limit approach pseudo-random noise. This action will defeat any jamming attempt. By sweeping the injected signal, the input to the loop can be pulsed and the lock indicator will still function. The pulse rate can be constant or vary and may be higher or lower than the injected frequency.

The circuit in accordance with the present invention can be implemented in phase lock loops operating over a wide range of frequencies. While the preferred embodiment is at microwave frequencies, it can be extended to much lower or higher frequencies.

DESCRIPTION OF THE PREFERRED EMBODIMENT

Figure 1:
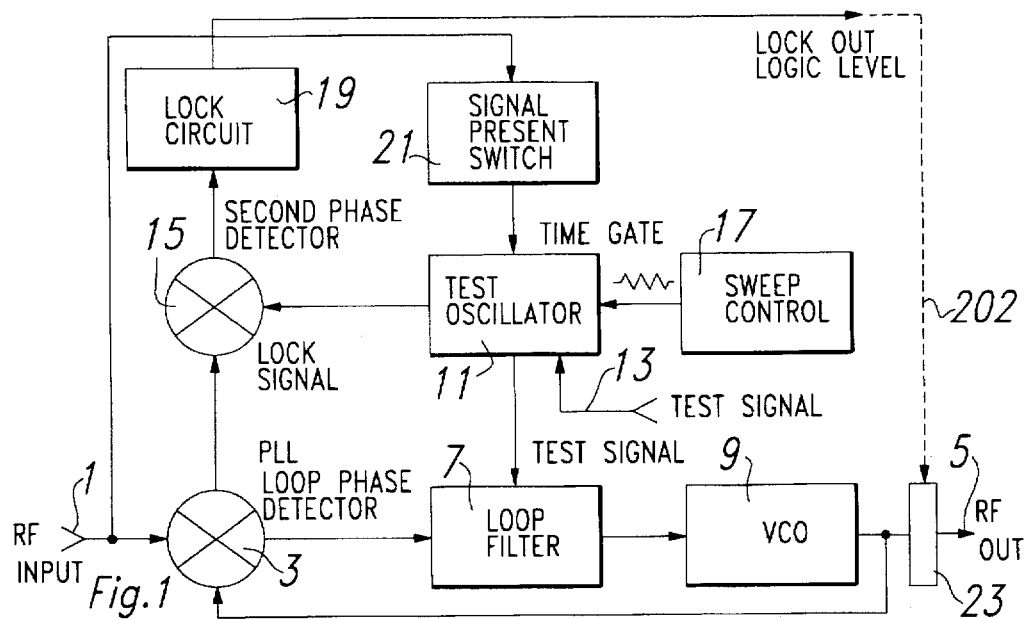
FIG. 1 is a block diagram of a lock detection circuit for a phase lock loop with continuous or pulsed input in accordance with the present invention.

Referring to FIG. 1, there is shown a lock detection circuit for a phase lock loop with continuous or pulsed input in accordance with the present invention. The circuit includes the PLL whose health is to be checked. This portion of the circuit includes a RF input 1 from, for example, a radar, to a PLL loop phase detector 3. It is necessary that the PLL provide a signal which mimics the RF input, and then transmit such a mimic signal from the RF output 5. The PLL further includes a loop filter 7 and a voltage controlled oscillator (VCO) 9 in series with a loop coupling the VCO back to the phase detector 3. The phase detector provides an output to the loop filter, this output being an error signal indicative of the difference between the RF input and the output of the VCO. The changes in the output from the detector 3 travel through the filter 7 and cause a change in the frequency of the output of the VCO 9, depending upon what the loop filter circuitry determines, as is well known. Accordingly, the RF output 5 will look like the RF input 1.

However, there is no certainty that the RF output 5 is truly mimicking the RF input 1. There are many sources for error, such as, when the RF input 1 is turning on and off. It is often imperative that the RF output 5 not be provided unless it is exactly on frequency. It follows that a check must be made to insure that the PLL is working and performing its function correctly and accurately. This is accomplished by the additional circuitry as shown in FIG. 1.

The additional circuitry includes a low frequency oscillator 11, the term "low" meaning that the frequency is low compared to the frequency of the RF input 1. The frequency of oscillator 11 can be from a few hertz to gigahertz and is generally a few kilohertz. The oscillator 11 is only on when there is an RF input on the RF input line 1. Accordingly, any signal on the RF input line 1 is provided at a signal present circuit 21 which senses the presence or absence of a signal at the RF input 1 and turns the oscillator 11 on when there is a signal and off when there is no signal.

Upon command at the lock gate input 13 to oscillator 11, which can be, for example, a signal from the pilot of an aircraft, the oscillator 11 provides a signal to the loop filter 7, that signal then being circulated in the PLL. The output of oscillator 11 can be a standard sine wave, square wave or other periodic waveform. The output can be of a predetermined frequency or variable frequency. The variable frequency is controlled by sweep circuit 17. The sweep from sweep circuit 17 can be linear or non-linear, continuous, pseudorandom or random. The output frequency from test oscillator 11 will follow this sweep and change accordingly. The type of sweep used will be dictated by the operational requirements for the PLL. A linear up/down sweep is appropriate for an RF input 1 that is pulsed at a rapid rate. A random sweep is appropriate for either a pulsed RF input 1 or when deliberate jamming of RF input 1 is anticipated. The output of oscillator 11 passes through the loop filter 7, the VCO 9 and the detector 3 to a second phase detector 15 where the signal from oscillator 11 is compared with a signal from detector 3. This signal passes through the loop filter 7, the VCO 9 and the detector 3 to a second phase detector 15 where the signal from the oscillator 11 is compared with the signal from the detector 3. If the signals at second phase detector 15 match, this is an indication that the PLL circuit is operating properly and the detector 15 then sends a signal to a lock circuit 19 indicative of that condition. Meanwhile, the test oscillator 11 is turned off, either in response to an appropriate signal from the lock circuit 19 (not shown) of by timing of the test procedure whereby the test oscillator 11 is turned off after a predetermined time has elapsed. The lock circuit 15 then provides a signal to an inhibit circuit 23 which permits the output of the VCO 9 which mimics the input on RF input 1 to be transmitted.

It can be seen that, in accordance with the above procedure, pulsed signals on the RF input 1 as well as jamming signals will not affect the operation of the PLL circuit. Furthermore, the PLL circuit will only transmit when it is operating properly.

Figure 2:
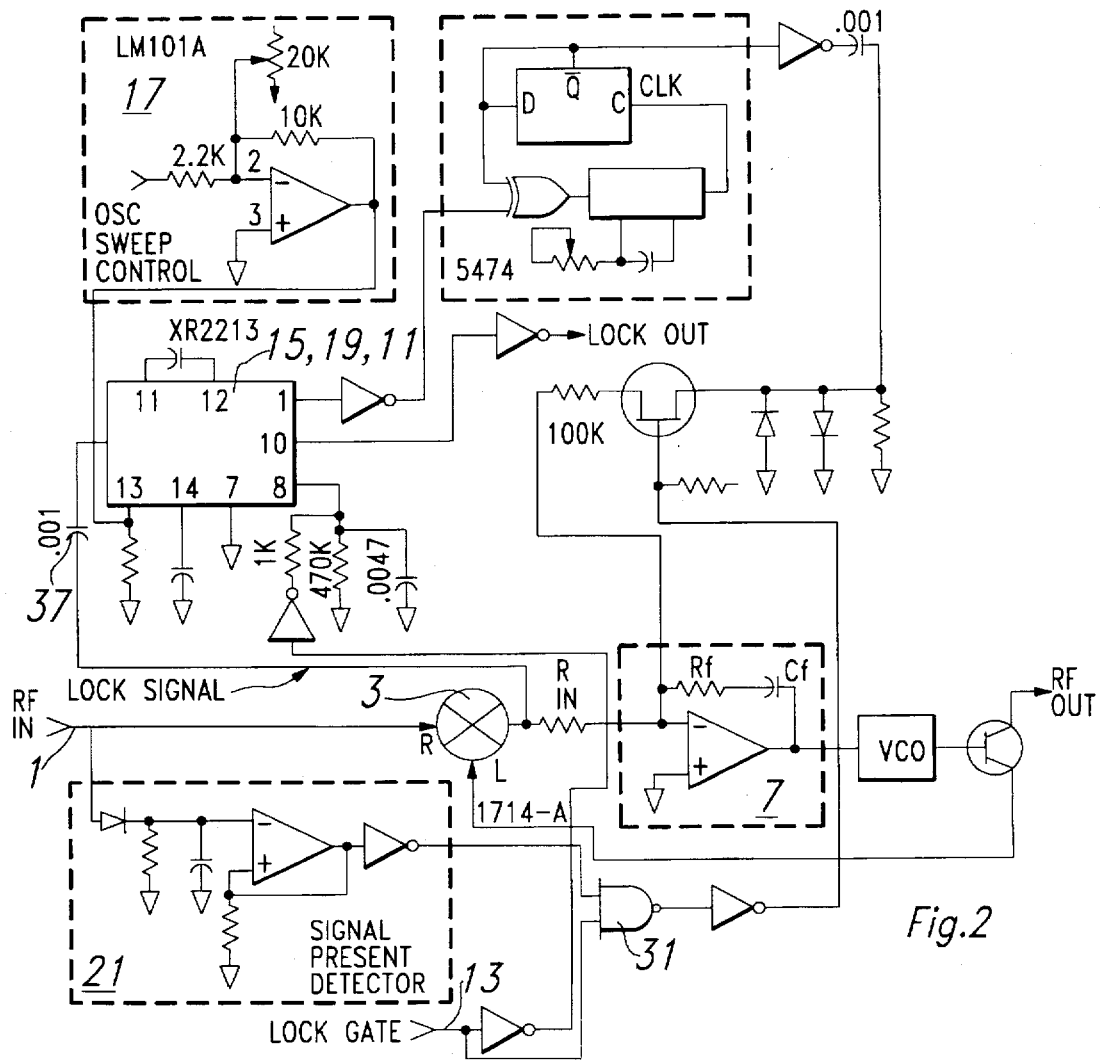
FIG. 2 is a circuit diagram of a complete it as in FIG. 1.

A typical hardware embodiment of the circuit of FIG. 1 is shown in FIG. 2 wherein like circuitry is provided with the same reference number as in FIG. 1. The circuit includes an RF input terminal 1 which feeds a PLL loop phase detector 3 as well as a signal present detector or switch 21. The PLL includes the loop filter 7 which includes an operational amplifier with RC feedback thereacross of standard type and a VCO 9, the VCO output being coupled to the RF output 5. The signal present detector 21 is composed of a diode detector followed by a comparator circuit of standard type. Also provided is a lock gate 13, the signals from the lock gate and the output of the detector 21 being provided to NAND logic 31 which controls operation of a switch 33. Switch 33 controls injection of a signal from the test oscillator 11 to the loop filter 7. The output of the detector 3 is also fed via a capacitor 37 to the second phase detector 15 which is shown as a part of the XR 2213 integrated circuit, this circuit also including the lock circuit 19 and the test oscillator 11. An oscillator sweep control circuit 17 is coupled to the test oscillator 11 and, as shown, provides a sawtooth wave output, control circuit 17 being used to demonstrate that almost any type of signal can be used to control the frequency output of the test oscillator 11. The circuit shown as 38 is a signal shaping circuit for the output of the oscillator 11 and does not form a part of the invention.

In operation, with reference to FIGS. 1 and 2, when an appropriate signal is provided on both lock gate 13 and RF input 1, the NAND gate 31 (FIG. 2) provides a signal to open switch 33 and allow the shaped signal from test oscillator 11 to travel to the loop filter 7. The output from loop filter 7 modulates the frequency of VCO 9 with the signals from test oscillator 11. The output of VCO 9 is applied to the detector 3 and compared to the RF input 1. The output of detector 3 contains the error signal information necessary to correct the VCO 9 and a replica of the output of the test oscillator 11. This replica from detector 3 is coupled through capacitor 37 (FIG. 2) and is compared with the output of test oscillator 11 by the detector 15. The output from detector 3 will be pulsed or continuous, depending upon RF input 1. If test oscillator 11 is sweeping in frequency, the replica will also be sweeping in frequency.

Detector 15 is a second phase detector used to examine the integrity of the replica signal from detector 3. Detector 15 compares the replica signal with a sample of the original signal from test oscillator 11. The implementation of this detector can be either a passive device using diodes or an active device using transistors, FETs, etc. All implementations operate in similar manner. The hardware embodiment herein uses the active phase detector circuit integral to the XR 2213 integrated circuit. This type of phase detector provides an instantaneous, continuous comparison of the two inputs. The output that results from this comparison is a voltage. If the two inputs are not at the same frequency, the output will be a time varying waveform at a frequency equal to the difference between the two inputs. If the two inputs are at the same frequency, the output will be a continuous level that indicates the phase difference between the two inputs.

Lock circuit 19 integrates the output of second phase detector 15. If the two inputs to second phase detector 15 are not at the same frequency, the time varying voltage output will not cause the output from lock circuit 19 to integrate to an appropriate value. If these inputs are at the same frequency, the continuous level output from second phase detector 15 will cause lock circuit 19 to integrate up to a voltage dependent on the phase difference. A comparison circuit within lock circuit 19 samples the integrated voltage. If the two inputs to second phase detector 15 are not at the same frequency, the comparison will indicate no PLL lock by transmitting a low logic level signal 202. If the two inputs to second phase detector 15 are at the correct frequency and at a phase shift predetermined by the PLL circuit design, the comparison circuit in lock circuit 19 senses a continuous voltage output from second phase detector 15 at the correct level expected when the PLL is in lock. The comparison indicates PLL lock by transmitting a high logic level signal 202. Thus, a high level logic signal 202 will only occur if the VCO 9 is at exactly the correct frequency and phase when the PLL is in lock. Spurious signals on RF input 1 that might represent incidental noise, interference or deliberate attempts at jamming are ignored by this circuit. With a sweeping frequency injected signal from test oscillator 11, a jamming signal could never be continuously close enough in frequency to fool lock circuit 19 into falsely integrating to a voltage that would indicate PLL lock. With appropriate choice of integration values for lock circuit 19, PLL lock also will always be correctly indicated, even in the face of jamming attempts.

If the RF input 1 is continuous, the lock detection is not interrupted and a logic level lock indication is rendered quickly. If the RF input 1 is non-continuous (i.e. pulsed in some manner), a test for PLL lock can only proceed when there is an input signal present. The signal present switch 21 senses the RF signal 1 presence. Lock circuit 19 must be designed to accommodate the pulsed signal operation. With a pulsed input, there will be no output from detector 3 and, in turn, no output from second phase detector 15 when there is no RF input 1, even if the PLL is correctly on frequency. Lock circuit 19 is designed with this constraint. The integration time constants are set to accommodate the expected periodic signal loss and only integrate during the time RF input 1 is present. A correct determination of the locked state of the PLL to the non-continuous input is thus possible. If test oscillator 11 is a fixed frequency, problems can occur if the pulse rate of RF input 1 is close to the frequency of test oscillator 11. By making the frequency of test oscillator 11 a variable frequency as described hereinabove controlled by sweep control circuit 17, the output frequency of test oscillator 11 will be continuously varying and never at the same frequency as the pulse rate of RF input 1 for more than a very short time. The PLL in lock indicator signal 202 can be used either as an indication of lock for a panel indicator and/or to control inhibit circuitry 23 that prevents RF output 5 unless the PLL is correctly locked.

It is therefore apparent that the circuit in accordance with the present invention is capable of lock detection for a PLL with a continuous RF input 1, pulsed RF input 1 or either pulse or continuous input mixed with deliberate or incidental interference, this being accomplished in conjunction with the sweeping frequency signal provided by the test oscillator 11. Furthermore, the circuit can be implemented in discrete circuits, hybrid circuits or integrated circuit technology.

Though the invention has been described with reference to a specific preferred embodiment thereof, many variations and modifications will immediately become apparent to those skilled in the art. It is therefore the intention that the appended claims be interpreted as broadly as possible in view of the prior art to include all such variations and modifications.

I claim:

1. A lock detection circuit for a phase lock loop circuit which comprises:
   (a) a phase lock loop circuit having a signal input terminal and a signal output terminal; and
   (b) a test circuit coupled to said phase lock loop circuit including:
      (i) signal generating means responsive to the presence of an input signal on said input terminal for injecting a signal into said phase lock loop;
      (ii) means for comparing the signal in said phase lock loop with a signal on said signal input terminal to alter the signal in said phase lock loop and provide a replica of the injected signal; and
      (iii) means responsive to a substantial match of said replica of the injected signal and said injected signal to provide an indication thereof.

2. The circuit of claim 1 wherein the injected signal is a swept frequency signal.

3. The circuit of claim 2 wherein the injected signal is one of a series of pulses or a random signal.

4. The circuit of claim 1 wherein said phase lock loop comprises the series circuit of a detector, a filter and a voltage controlled oscillator, the output of said phase lock loop circuit being the output of said oscillator.

5. The circuit of claim 2 wherein said phase lock loop comprises the series circuit of a detector, a filter and a voltage controlled oscillator, the output of said phase lock loop circuit being the output of said oscillator.

6. The circuit of claim 3 wherein said phase lock loop comprises the series circuit of a detector, a filter and a voltage controlled oscillator, the output of said phase lock loop circuit being the output of said oscillator.

7. The circuit of claim 4 wherein said injected signal is injected into said phase lock loop ahead of said filter.

8. The circuit of claim 5 wherein said injected signal is injected into said phase lock loop ahead of said filter.

9. The circuit of claim 6 wherein said injected signal is injected into said phase lock loop ahead of said filter.

10. The circuit of claim 1 further including inhibit means coupled to the said output terminal of said phase lock loop normally inhibiting an output from said output terminal of said phase lock loop, said inhibit means responsive to a said substantial match to disinhibit said inhibit means.

11. The circuit of claim 2 further including inhibit means coupled to the said output terminal of said phase lock loop normally inhibiting an output from said output terminal of said phase lock loop, said inhibit means responsive to a said substantial match to disinhibit said inhibit means.

12. The circuit of claim 4 further including inhibit means coupled to the said output terminal of said phase lock loop normally inhibiting an output from said output terminal of said phase lock loop, said inhibit means responsive to a said substantial match to disinhibit said inhibit means.

13. The circuit of claim 5 further including inhibit means coupled to the said output terminal of said phase lock loop normally inhibiting an output from said output terminal of said phase lock loop, said inhibit means responsive to a said substantial match to disinhibit said inhibit means.

14. The circuit of claim 7 further including inhibit means coupled to the said output terminal of said phase lock loop normally inhibiting an output from said output terminal of said phase lock loop, said inhibit means responsive to a said substantial match to disinhibit said inhibit means.

15. The circuit of claim 8 further including inhibit means coupled to the said output terminal of said phase lock loop normally inhibiting an output from said output terminal of said phase lock loop, said inhibit means responsive to a said substantial match to disinhibit said inhibit means.

16. The circuit of claim 1 wherein said match is a match of frequency and phase.

17. The circuit of claim 1 further including an input signal received at said input terminal which is pulsed.

18. A lock detection method for a phase lock loop circuit which comprises:
   (a) providing a phase lock loop circuit having a signal input terminal and a signal output terminal;
   (b) receiving a pulsed RF input signal at said signal input terminal;
   (c) applying to said phase lock loop circuit, responsive to the presence of an RF input signal on said input terminal, a swept frequency signal;
   (d) comparing the signal in said phase lock loop with said pulsed RF input signal to provide an error signal;
   (e) altering the signal in said phase lock loop in response to said error signal; and
   (f) comparing said swept frequency signal with said error signal to control the output terminal of said phase lock loop.

19. The method of claim 18 wherein the frequencies of the swept frequency signal are less than the frequency of signals to be received at said input terminal.

20. The method of claim 18 wherein the step of controlling the output terminal of said phase lock loop includes inhibiting and disinhibiting transmission therefrom.

21. The method of claim 19 wherein the step of controlling the output terminal of said phase lock loop includes inhibiting and disinhibiting transmission therefrom.

* * * * *